United States Patent
Fornara

(10) Patent No.: US 8,222,094 B2
(45) Date of Patent: Jul. 17, 2012

(54) METHOD FOR MANUFACTURING AN EEPROM CELL

(75) Inventor: Pascal Fornara, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 90 days.

(21) Appl. No.: 12/326,542

(22) Filed: Dec. 2, 2008

(65) Prior Publication Data
US 2009/0146214 A1    Jun. 11, 2009

(30) Foreign Application Priority Data

Dec. 5, 2007  (FR) ..................... 07 59563

(51) Int. Cl.
*H01L 21/00* (2006.01)
*H01L 29/66* (2006.01)

(52) U.S. Cl. ............... 438/157; 257/365; 257/E21.421; 257/E29.17; 257/E29.264

(58) Field of Classification Search .................. 257/365, 257/E21.421, E29.17, E29.264; 438/283, 438/257, 266, 762, 157, 176, 197; 365/104, 365/156, 185.18, 185.29
See application file for complete search history.

(56) References Cited

U.S. PATENT DOCUMENTS

| 5,554,552 A * | 9/1996 | Chi ............................. 438/264 |
| 5,591,681 A | 1/1997 | Wristers et al. |
| 5,936,883 A | 8/1999 | Kurooka et al. |
| 2007/0069278 A1 | 3/2007 | Bouchakour et al. |

OTHER PUBLICATIONS

French Search Report dated Jul. 24, 2008 from French Patent Application No. 07/59563.

* cited by examiner

*Primary Examiner* — A. Sefer
*Assistant Examiner* — Nikolay Yushin
(74) *Attorney, Agent, or Firm* — Wolf, Greenfield & Sacks, P.C.

(57) ABSTRACT

A method for manufacturing a cell of a non-volatile electrically erasable and programmable memory including a dual-gate MOS transistor. The method includes the steps of providing a semiconductor substrate covered with an insulating layer including a thinned down portion and having a first surface common with the substrate and a second surface opposite to the first surface; and incorporating nitrogen at the level of the second surface, whereby the maximum nitrogen concentration is closer to the second surface than to the first surface.

15 Claims, 3 Drawing Sheets

METHOD FOR MANUFACTURING AN EEPROM CELL

CROSS REFERENCE TO RELATED APPLICATIONS

This application claims the priority benefit of French patent application Ser. No. 07/59563, filed on Dec. 5, 2007, entitled "Method for Manufacturing an Eeprom Cell," which is hereby incorporated by reference to the maximum extent allowable by law.

BACKGROUND OF THE INVENTION

1. Field of the Invention

The present invention relates to methods for manufacturing cells of an electrically erasable and programmable non-volatile memory or EEPROM cells and to the memory cells obtained with such methods.

2. Discussion of the Related Art

An EEPROM cell generally comprises a selection element and a storage element. As an example, the selection element corresponds to a conventional single-gate MOS transistor and the storage element corresponds to a dual-gate MOS transistor comprising a floating gate covered with a control gate. The floating gate insulator comprises a thinned portion at the level of the dual-gate transistor drain which forms a tunnel window. The tunnel window is thin enough to enable tunneling, of carriers between the floating gate and the underlying channel.

The operation of such a memory cell is the following. An erasing operation in the memory cell is performed by turning on the selection transistor, by setting to 0 volt the drain and the source of the dual-gate transistor, and by setting the control gate of the dual-gate transistor to a given voltage. This causes the passing of charges (electrons) from the drain to the floating gate of the dual-gate transistor through the tunnel window and the storage of charges in the floating gate. A write operation in the memory is performed by turning on the selection transistor, by applying a write voltage between the drain and the source of the dual-gate transistor and by maintaining the control gate of the dual-gate transistor at 0 volt. This causes the evacuation of the charges stored in the floating gate through the tunnel window. A read operation is performed by turning on the selection transistor, by applying a read voltage, smaller than the write voltage, between the drain and the source of the dual-gate transistor, and by setting the control gate of the dual-gate transistor to a given voltage. The intensity of the current crossing the dual-gate transistor is representative of the presence or of the absence of charges in the floating gate.

A disadvantage of a conventional EEPROM cell is that a leakage of the charges stored in the floating gate of the storage element, which tend to escape through the tunnel window, can be observed. Indeed, the thickness of the floating gate insulator at the level of the tunnel window is generally smaller than some ten nanometers and the charges are mainly stored in the floating gate close to the tunnel window so that charges stored in the floating gate can cross the tunnel window by mere thermal agitation.

U.S. patent application Ser. No. 11/525,529, which is incorporated herein by reference, describes a method for manufacturing an EEPROM cell enabling improving the charge retention in the floating gate of the storage cell. For this purpose, the floating gate comprises an N-type doped region, at the level of a thick portion of the floating gate insulator, surrounded with P-type doped regions. The charges injected into the floating gate tend to be stored in the N-type region which is distant from the tunnel window. Leakage risks are thus decreased, since charges are stored at the level of a thick oxide portion.

However, the forming of the N- and P-type doped regions has disadvantages. Indeed, the P-type doped regions are generally formed by a step of implantation of P-type dopants, such as boron, into the floating gate which is previously N-type doped. The diffusion of dopant elements from the floating gate into the substrate can be observed during subsequent anneal steps. This tends to modify the dopant concentration profiles in the substrate, which is not desirable.

SUMMARY OF THE INVENTION

An aspect of the present invention aims at a method for manufacturing an EEPROM cell which enables improving the charge retention in the floating gate of the memory cell and which does not have the previously-described disadvantages.

Another aspect of the present invention aims at a memory cell which enables better retention of the charges in the floating gate.

Thus, an embodiment of the present invention provides a method for manufacturing a cell of a non-volatile electrically erasable and programmable memory comprising a dual-gate MOS transistor. The method comprises the steps of:

(a) providing a semiconductor substrate covered with an insulating layer comprising a thinned down portion and having a first surface common with the substrate and a second surface opposite to the first surface; and (b) incorporating nitrogen at the level of the second surface, whereby the maximum nitrogen concentration is closer to the second surface than to the first surface.

According to an embodiment, the method further comprises the steps of:

(c) forming on the insulating layer a semiconductor layer comprising at least a first region doped with a first dopant type;

(d) forming in the semiconductor layer, by implantation, at least a second region doped with a second dopant type, the first or the second region covering the thinned down insulating portion; and (e) forming the gates of the MOS transistor at least partially comprising the first and second regions.

According to an embodiment, the thinned down portion has a thickness smaller than 10 nm and the insulating portion has a thickness, outside of the thinned down portion, greater than 10 nm.

According to an embodiment, at step (c), the nitrogen incorporation is obtained by arranging said insulating layer in a nitrogen plasma.

According to an embodiment, at step (c), the semiconductor layer is totally doped with the first dopant type as it is being formed.

According to an embodiment, the first region is an N-type doped region and the second region is a P-type doped region.

An embodiment of the present invention also provides a cell of a non-volatile electrically erasable and programmable memory formed at the level of a semiconductor substrate. The cell comprises a dual-gate MOS transistor in which the gate is separated from the substrate by an insulating layer. The insulating layer comprises a thinned down portion and has a first surface common with the substrate and a second surface opposite to the first surface. The insulating layer comprises nitrogen, the maximum nitrogen concentration being closer to the second surface than to the first surface.

According to an embodiment, the gate comprises a first region doped with a first dopant type and a second region doped with a second dopant type covering the thinned down portion.

According to an embodiment, the thinned down portion has a thickness smaller than 10 nm and the insulating layer has a thickness, outside of the thinned down portion, greater than 10 nm.

An embodiment of the present invention also provides an electronic circuit comprising a non-volatile electrically erasable and programmable memory comprising cells such as previously defined, and an integrated circuit separate from the memory and connected to the memory.

The foregoing objects, features, and advantages of the present invention will be discussed in detail in the following non-limiting description of specific embodiments in connection with the accompanying drawings.

DETAILED DESCRIPTION

Figure 1A:
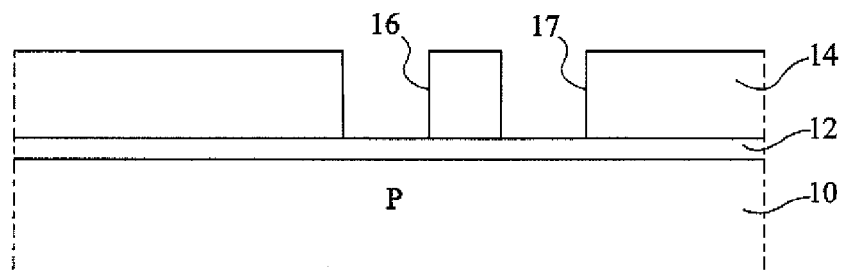
FIGS. 1A to 1K show the structures obtained after successive steps of an example of a method for manufacturing an EEPROM cell according to the present invention.

For clarity, the same elements have been designated with the same reference numerals in the different drawings and, further, as usual in the representation of integrated circuits, the various drawings are not to scale.

To prevent the diffusion of P-type dopant elements in the EEPROM cell substrate in the step of forming, by implantation, of P-type doped regions in the floating gate of the EEPROM cell storage element, the applicant has first tried to use a method similar to that implemented in CMOS manufacturing processes. Indeed, in manufacturing of conventional P-channel MOS transistors, the transistor gate is generally doped by implantation of P-type dopant elements. To prevent the diffusion of the dopant elements of the transistor gate into the underlying substrate, a nitrided oxide which is obtained by growing a silicon oxide layer under a nitrogen flow (in the form of nitrogen oxide NO or of nitrogen dioxide $NO_2$) is used as a gate insulator.

The floating gate insulator of the EEPROM cell storage element is generally obtained by first forming a "thick" oxide layer, by forming an opening in the "thick" layer, and by forming, in the opening, a thinned down oxide portion which corresponds to the tunnel window.

By applying a nitriding method similar to what is provided in CMOS manufacturing processes on forming of the thinned down portion of the floating gate, the applicant has shown a poor operation of the EEPROM cell thus obtained. Indeed, a phenomenon of trapping of positive charges under the floating gate insulator has appeared, especially at the level of the thick portions of this insulator. By many tests, the applicant has shown that the trapping of positive charges results from a nitrogen accumulation which substantially occurs over the entire interface between the floating gate insulator and the underlying substrate, be it at the level of the tunnel window or of the thick oxide portions. The presence of nitrogen under the entire floating gate insulator is due to the thinned down portion forming method. Indeed, said portion is formed by growing a thin oxide layer, under a nitrogenous atmosphere, in the opening provided in the thick oxide layer. However, if the nitrided oxide preferentially tends to grow in the opening, it also grows over the entire thick oxide layer. At the subsequent anneal steps, the nitrogen tends to migrate to the interface between the floating gate insulator and the underlying substrate over the entire floating gate insulator.

The applicant has devised a method enabling preventing the accumulation of nitrogen at the interface between the floating gate insulator and the underlying substrate.

FIGS. 1A to 1K are cross-section views of an EEPROM cell at successive steps of an example of a method for manufacturing the memory cell.

FIG. 1A shows the structure obtained after the steps of:

forming on a semiconductor substrate 10, for example, a P-type doped single-crystal silicon substrate, of an insulating layer 12, for example, a silicon oxide layer having a thickness greater than 10 nm, for example, on the order of 20 nm;

deposition of a masking film 14, for example, a resist, on insulating layer 12; and forming of openings 16, 17 in film 14, for example, by a photolithographic etch method using a first mask (not shown) to insolate film 14. Openings 16, 17 are respectively formed above the portions of substrate 10 where the drain and source regions of the dual-gate transistor are desired to be formed.

Figure 1B:
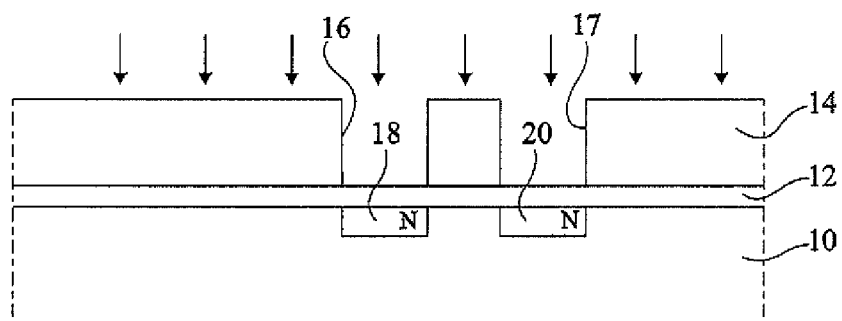

FIG. 1B shows the structure obtained after having performed an implantation step resulting in the forming of doped regions 18, 20, for example, of type N, in substrate 10 in prolongation of openings 16, 17.

Figure 1C:
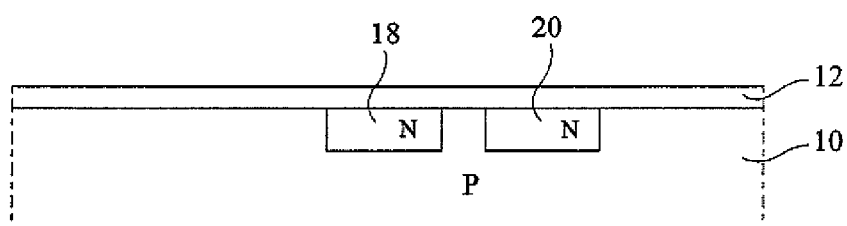

FIG. 1C shows the structure obtained after having removed film 14 and having performed an activation anneal. The anneal causes a diffusion of dopant elements from regions 18 and 20, which results in an expansion of regions 18 and 20.

Figure 1D:
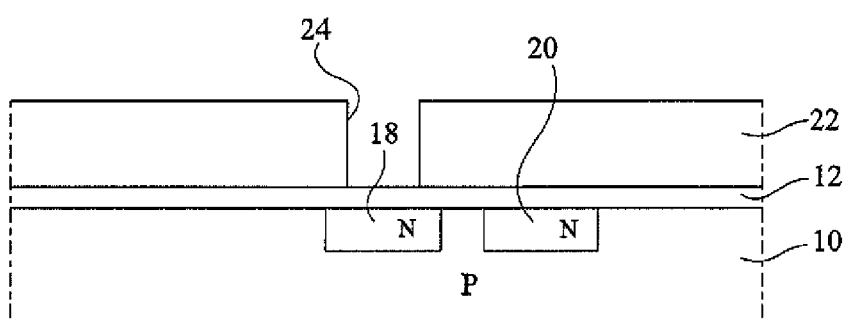

FIG. 1D shows the structure obtained after having deposited a masking film 22, for example a resist, on insulating layer 12 and after having formed an opening 24 in film 22 above the portion of insulating layer 12 where the tunnel window of the dual-gate transistor is desired to be formed. The etching of film 22 may be performed by a photolithographic etch method using a second mask (not shown) to insolate film 22.

Figure 1E:
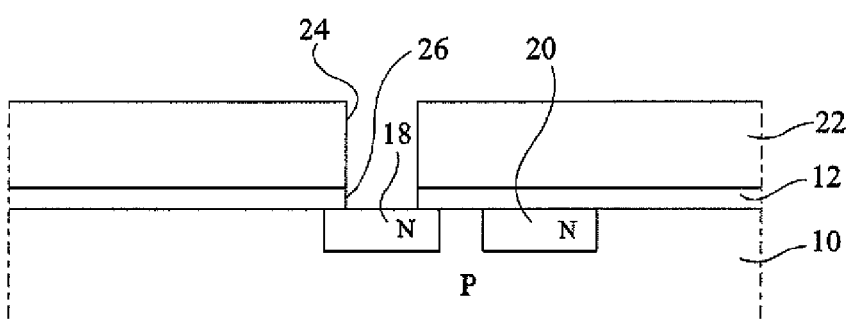

FIG. 1E shows the structure obtained after having etched insulating layer 12 to form an opening 26 therein, in prolongation of opening 24.

Figure 1F:
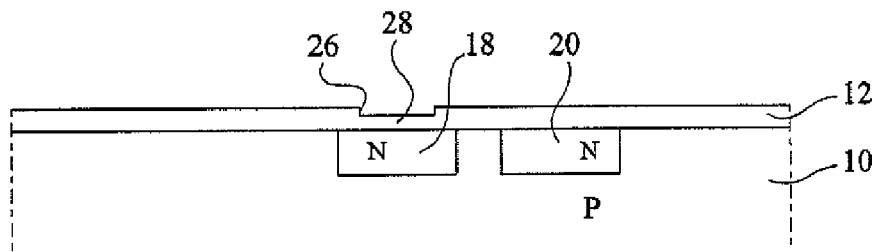

FIG. 1F shows the structure obtained after having removed film 22 and after having formed a thinned down insulating portion 28, for example silicon nitride having a thickness smaller than 10 nm, for example, on the order of from 5 to 7 nm, at the level of opening 26, with thinned down insulating portion 28 forming the tunnel window of the dual-gate transistor. Region 18 extends under the entire tunnel window 28. At this step, the thickness of layer 12 may increase by a few nanometers.

Figure 1G:
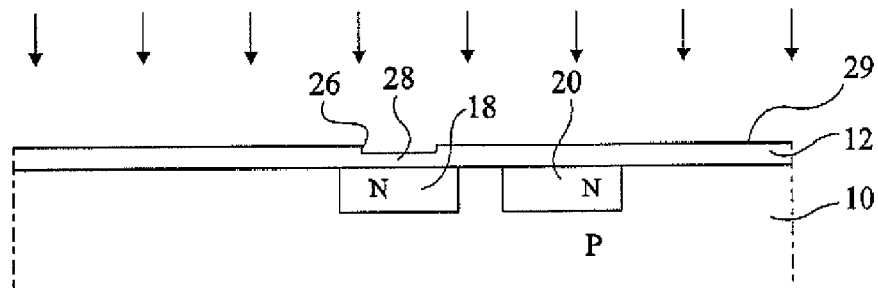

FIG. 1G shows the structure obtained after having performed a nitrogen incorporation step which results in the increase of the nitrogen concentration at the level of free surface 29 of layer 12 and of thinned down portion 28. As an example, the nitrogen incorporation may be performed by placing the structure of FIG. 1F in the chamber of an induction plasma reactor, for example, the high-density reactor sold by Applied Material Company under trade name DPS. The reactor comprises a radio-frequency generator (for example at 13.6 MHz) which enables forming a plasma, from nitrogen ($N_2$) introduced into the chamber, via an inductive coupling. The forming of $N^{2+}$ ions and of nitrogen radicals is thus obtained in the reactor chamber. The nitrogen element diffuses to free surface 29 of silicon oxide layer 12 and of thinned down portion 28 where it is adsorbed and chemically incorporated to layer 12 and to thinned down portion 28. The method takes place at temperatures smaller than some hundred degrees. To enable incorporation of nitrogen into upper surface 29 of oxide layer 12 and of thinned down portion 28, substrate 10 is biased by a radio-frequency generator which provides a pulse sequence, As an example, the pulse frequency may be on the order of from 10 to 50 kHz, for an effective power (corresponding to the ratio between the power of the generator providing the pulses and the duty cycle) on the order of from 70 to 1,000 W. The incorporation of nitrogen is followed by a non-oxidizing anneal step.

Figure 1H:
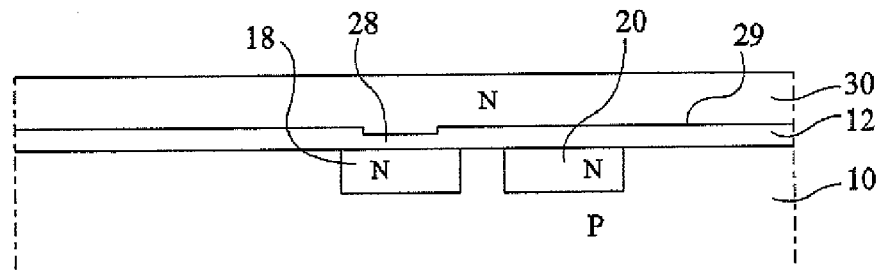

FIG. 1H shows the structure obtained after having deposited on nitrided oxide layer 12 and nitrided thinned down portion 28 an N-type doped polysilicon layer 30, for example having a thickness of approximately 100 nm. Layer 30 is for example obtained by an in situ doping method, that is, the N-type dopants are incorporated into layer 30 during the forming thereof.

Figure 1I:
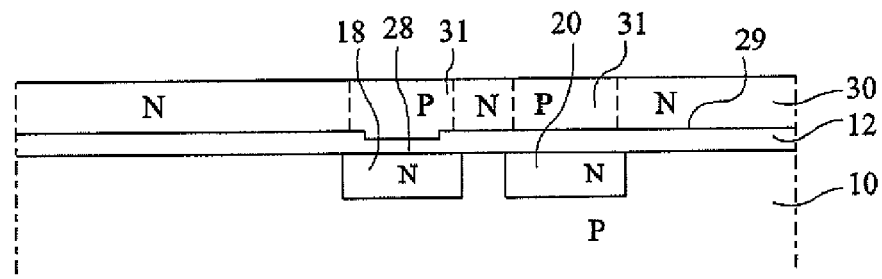

FIG. 1I shows the structure obtained after having performed a P-type dopant implantation into layer 30, which results in the forming of P-type doped regions 31 which extend over the entire thickness of layer 30. At least one of regions 31 extends over the entire tunnel window 28. As an example, the implantation step may be performed by using the mask which has already been used at step 1A to delimit openings 16, 17 in masking film 14. The presence of nitrided oxide at free surface 29 enables preventing the migration of the P-type dopant elements in substrate 10 during subsequent anneals.

Figure 1J:
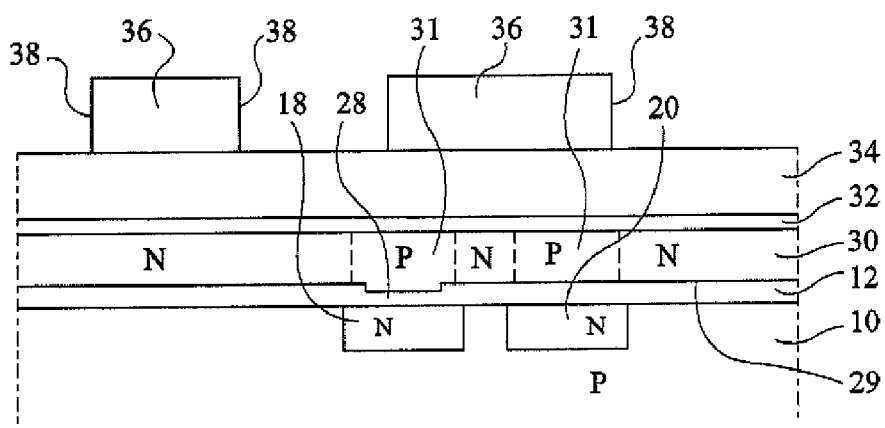

FIG. 1J shows the structure obtained after having carried out the steps of:

deposition on layer 30 of an insulating layer 32 for example corresponding to a silicon oxide layer having a thickness of approximately 16 nm;

deposition on layer 32 of a second polysilicon layer 34 for example having a thickness of approximately 200 nm; and deposition of a masking film 36, for example a resist, on layer 34; and etching of openings 38 in film 36 which follow the contours of the selection transistor and of the dual-gate transistor of the EEPROM cell. The etching of film 36 may be performed by a photolithographic etch method implementing a third mask (not shown) to insolate film 36.

Figure 1K:
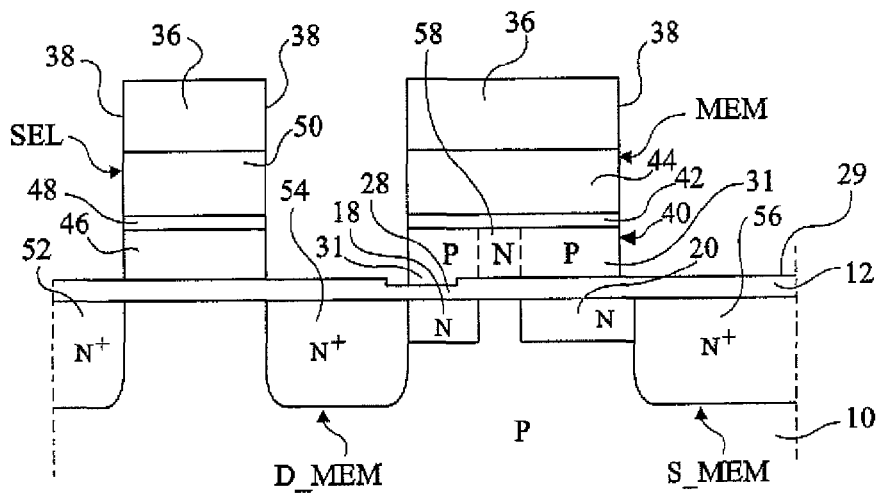

FIG. 1K shows the structure obtained after having anisotropically etched the stacking of layers 30, 32, 34 in prolongation of openings 38 of film 36 and after having carried out an N-type dopant implantation step. The etch step enables delimiting, for each memory cell, dual-gate transistor MEM and selection transistor SEL. Dual-gate transistor MEM comprises a portion 40 of polysilicon layer 30 which forms the floating gate, a portion 42 of insulating layer 32 which forms the control gate insulator, and a portion 44 of polysilicon layer 34 which forms the control gate. Selection transistor SEL comprises a portion 46 of layer 30, a portion 48 of layer 32, and a portion 50 of layer 34. It may be desirable for the operation of transistor SEL to be similar to that of a conventional single-gate MOS transistor. For this purpose, an opening may be provided in insulating portion 48 so that portions 46 and 50 are short-circuited.

The implantation step causes the forming in substrate 10 of heavily-doped N-type regions 52, 54, 56 in prolongation of openings 38. Region 54 forms, with region 18, drain region D_MEM of dual-gate transistor MEM. Further, region 54 forms the source of selection transistor SEL. Region 52 forms the drain of transistor SEL. Region 56 forms with region 52 source S_MEM of transistor MEM.

The step of etching of layers 30, 32, 34 enables delimiting an N-type doped region 58 in floating gate 40 which extends over the entire length of transistor MEM and interposed between the two P-type doped regions 31. Region 58 is used as a charge storage tank during the EEPROM cell operation.

The manufacturing example previously described in relation with FIGS. 1A to 1K has the advantage of only slightly modifying the steps of a conventional method for manufacturing an EEPROM cell, given that only the steps of nitrogen incorporation and of forming of the N and P doped regions in the floating gate of the EEPROM cell storage element are added.

Figure 2:
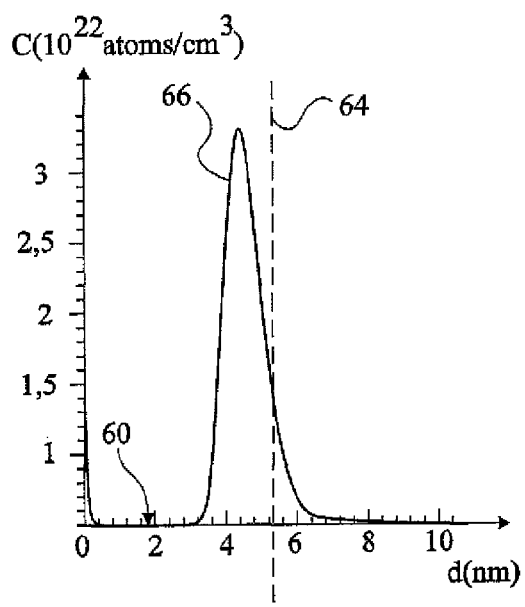
FIGS. 2 and 3 show curves of the variation of the nitrogen concentration in the floating gate insulator of the storage element of an EEPROM cell for two examples of a cell manufacturing method.
Figure 3:
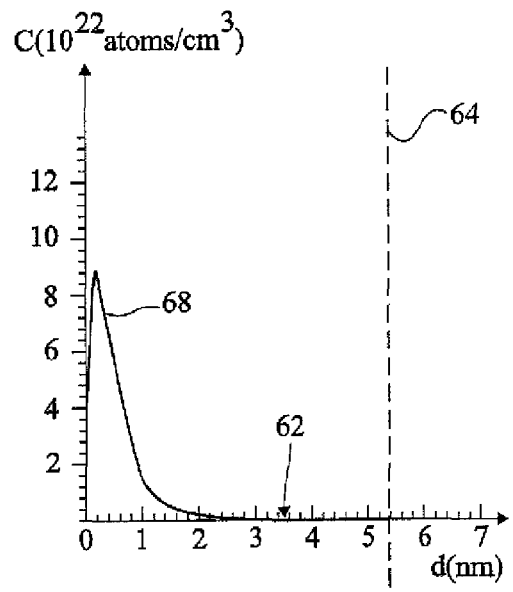

FIGS. 2 and 3 show examples of curves 60, 62 of the variation of concentration C of the nitrogen element in thinned down insulating portion 28 according to depth d measured from upper surface 29 of thinned down portion 28. Vertical line 64 in dotted lines shows the interface between thinned down insulating portion 28 (to the left of line 64) and underlying single-crystal silicon substrate 10 (to the right of line 64). Thinned down portion 28 has, for example, a thickness of approximately 5 nm. The ordinate axis then corresponds to surface 29 of thinned down insulating layer 28, that is, to the interface between thinned down insulating portion 28 and overlying gate 40. Curve 60 is obtained by test for a method for nitriding thinned down portion 28 similar to a method used in a CMOS manufacturing process and in which thinned down insulating portion 28 is grown under a nitrogen atmosphere. The curve comprises a peak 66 close to the interface between thinned down insulating portion 28 and underlying substrate 10. Curve 62 is obtained by test for the method example previously described in relation with FIGS. 1A to 1K. Curve 62 comprises a peak 68 close to surface 29 of thinned down insulating portion 28. The present method example thus enables displacing the nitrogen peak to the side of surface 29 of thinned down oxide portion 28. The absence of a significant nitrogen concentration at the interface between oxide layer 12 and underlying substrate 10 enables suppressing risks of charge storage during the memory cell operation. The fact for the maximum nitrogen concentration to be at the interface between oxide layer 12 and gate 40 enables distinguishing a memory cell obtained by the method according to the present invention from a memory cell, obtained by a method similar to a conventional CMOS manufacturing process method, for which the maximum nitrogen concentration is at the interface between oxide layer 12 (and of thinned down portion 28) and substrate 10. The fact of carrying out the nitrogen incorporation step after the step of forming of insulating layer 12 and of thinned down portion 28 enables implementing a nitrogen incorporation method providing a maximum nitrogen concentration at the interface between insulating layer 12 (and thinned down portion 28) and gate 40.

Figure 4:
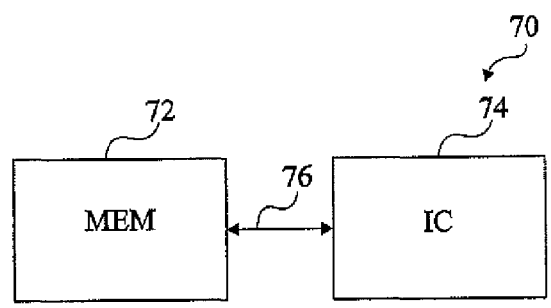
FIG. 4 schematically shows an electronic circuit comprising an EEPROM according to the present invention.

FIG. 4 schematically shows an electronic circuit 70 comprising an EEPROM 72 (MEM), formed of memory cells obtained by the method previously described in relation with FIGS. 1A to 1K. Electronic circuit 70 further comprises another integrated circuit 74 (IC), for example an interface circuit, connected to memory 72 by a connection 76, for example for the writing of data into memory 72 or the reading of data stored in memory 72.

Specific embodiments of the present invention have been described. Various variations and modifications will occur to those skilled in the art. In particular, the present invention has been described for a memory cell comprising a dual-gate transistor and a selection transistor. However, the present invention may apply to other memory cell structures, for example, memory cells for which the selection transistors are arranged in common between several memory cells, Further, in the previously-described embodiment, the MOS selection transistor is formed simultaneously with the dual-gate MOS transistor and itself comprises a possibly short-circuited dual-gate structure. It should however be clear that the selection MOS transistor may comprise a single gate. Further, although the previously-described examples relate to N-channel transistors, it should be clear that the present invention also applies to P-channel transistors, where the voltages applied to the transistors should be modified accordingly.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a cell of a non-volatile electrically erasable and programmable memory comprising a dual-gate MOS transistor (MEM), comprising the steps of:
   (a) providing a semiconductor substrate comprising at least one doped substrate region and at least one undoped substrate region, wherein at least the undoped substrate region of the semiconductor substrate is covered with an insulating layer comprising a thinned down portion and having a first surface common with the substrate and a second surface opposite to the first surface; and
   (b) incorporating nitrogen into the second surface, whereby the maximum nitrogen concentration is closer to the second surface than to the first surface.

2. The method of claim 1, further comprising the steps of:
   (c) forming on the insulating layer a semiconductor layer comprising at least a first region doped with a first dopant type;
   (d) forming in the semiconductor layer, by implantation, at least a second region doped with a second dopant type, the first or the second region covering the thinned down insulating portion; and
   (e) forming the gates of the MOS transistor at least partially comprising the first and second regions.

3. The method of claim 1, wherein the thinned down portion has a thickness smaller than 10 nm and wherein the insulating portion has a thickness, outside of the thinned down portion, greater than 10 nm.

4. The method of claim 1, wherein at step (b), the nitrogen incorporation is obtained by arranging said insulating layer in a nitrogen plasma.

5. The method of claim 2, wherein, at step (c), the semiconductor layer is totally doped with the first dopant type as it is being formed.

6. The method of claim 2, wherein the first region is an N-type doped region and the second region is a P-type doped region.

7. A cell of a non-volatile electrically erasable and programmable memory formed at the level of a semiconductor substrate, the cell comprising a dual-gate MOS transistor (MEM), wherein the gate is separated from the substrate by an insulating layer, the insulating layer comprising a single thinned down portion only in partial contact with the gate, the insulating layer having a first surface common with the substrate and a second surface opposite to the first surface, the insulating layer comprising nitrogen, the maximum nitrogen concentration being closer to the second surface than to the first surface.

8. The cell of claim 7, wherein the gate comprises a first region doped with a first dopant type and a second region doped with a second dopant type covering a portion of the thinned down portion.

9. The cell of claim 7, wherein the thinned down portion has a thickness smaller than 10 nm and wherein the insulating layer has a thickness, outside of the thinned down portion, greater than 10 nm.

10. An electronic system comprising a non-volatile electrically erasable and programmable memory comprising cells of claim 7, and an integrated circuit separate from the memory and connected to the memory.

11. A method for manufacturing a cell of a non-volatile electrically erasable and programmable memory comprising a dual-gate MOS transistor (MEM), the method comprising acts of:
   (a) providing a semiconductor substrate covered with an insulating layer comprising a thinned down portion, the insulating layer having a first surface common with the substrate which defines a first level and a second surface opposite to the first surface associated with a portion of the insulating layer that was not thinned down which defines a second level and a third surface associated with the thinned down portion which defines a third level; and
   (b) incorporating nitrogen into the insulating layer, whereby the nitrogen is distributed within the insulating layer such that a maximum concentration of nitrogen is located closer to the second level than to the first level within the portion of the insulating layer that was not thinned down and closer to the third level than to the first level within the thinned down portion.

12. The method of claim 11 wherein the nitrogen is further distributed such that an insignificant concentration of nitrogen is present at the first level.

13. The method of claim 11, further comprising acts of:
   (c) forming on the insulating layer a semiconductor layer comprising at least a first region doped with a first dopant type;
   (d) forming in the semiconductor layer, by implantation, at least a second region doped with a second dopant type, the first or the second region covering the thinned down insulating portion; and
   (e) forming the gates of the MOS transistor, the gates at least partially comprising the first and second regions.

14. A method for manufacturing a cell of a non-volatile electrically erasable and programmable memory comprising a dual-gate MOS transistor (MEM), the method comprising acts of:
   (a) providing a semiconductor substrate covered with an insulating layer of a first thickness, the insulating layer having a first surface common with the substrate which defines a first level and a second surface opposite to the first surface which defines a second level;
   (b) etching away a selected portion of the insulating layer at a selected location;
   (c) forming a thinned down insulating portion of a second thickness at the selected location, the thinned down insulating portion having a third surface at the first level and a fourth surface between the first level and the second level such that the second thickness is less than the first thickness;

(d) introducing nitrogen into the thinned down insulating portion such that the nitrogen has a concentration that varies within the thinned down insulating portion, wherein the nitrogen concentration peaks at a depth closer to the fourth surface than the third surface.

15. A cell of a non-volatile electrically erasable and programmable memory formed at the level of a semiconductor substrate, the cell comprising:

a dual-gate MOS transistor (MEM) wherein:

the gate is separated from the substrate by an insulating layer, the insulating layer comprising:

a first surface common with at least a portion of the substrate, the first surface defining a first level;

a second surface opposite to the first surface, the second surface defining a second level;

a thinned down portion with a third surface defining a third level between the first and second levels, wherein the third surface is only in partial contact with the gate;

the insulating layer comprising nitrogen, wherein the nitrogen is distributed within the insulating layer such that a maximum concentration of nitrogen is located closer to the third level than to the first level within the thinned down portion and closer to the second level than to the first level within the portion of the insulating layer that was not thinned down.

* * * * *